United States Patent
Lo et al.

(10) Patent No.: US 6,282,096 B1
(45) Date of Patent: Aug. 28, 2001

(54) INTEGRATION OF HEAT CONDUCTING APPARATUS AND CHIP CARRIER IN IC PACKAGE

(75) Inventors: Randy H. Y. Lo, Taipei; Chi Chuan Wu, Taichung, both of (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 09/561,057

(22) Filed: Apr. 28, 2000

(51) Int. Cl.[7] .................................................. H05K 7/20
(52) U.S. Cl. ........................ 361/704; 361/707; 361/709; 361/710; 361/713; 361/714; 361/717; 361/718; 361/719; 257/706; 257/717; 257/719; 174/16.3; 165/80.2; 165/185
(58) Field of Search .................................. 361/704–710, 361/715–722, 742, 760; 257/704, 706, 707, 710, 712, 713, 717–719; 165/80.2, 80.3, 185; 174/16.3

(56) References Cited

U.S. PATENT DOCUMENTS

| 4,561,001 | * | 12/1985 | Kohara et al. ........................ 257/713 |
| 5,311,402 | | 5/1994 | Kobayashi et al. . |
| 5,396,403 | * | 3/1995 | Patel ..................................... 361/705 |
| 5,528,462 | * | 6/1996 | Pendse ................................. 361/767 |
| 5,587,882 | * | 12/1996 | Patel ..................................... 361/705 |
| 5,875,096 | * | 2/1999 | Gates ................................... 361/704 |
| 5,889,323 | * | 3/1999 | Tachibana ............................ 257/704 |
| 5,926,371 | * | 7/1999 | Dolbear ............................... 361/704 |
| 5,931,222 | * | 8/1999 | Toy et al. ............................ 165/80.3 |
| 6,008,536 | * | 12/1999 | Mertol ................................. 257/704 |

* cited by examiner

Primary Examiner—Leo P. Picard
Assistant Examiner—Boris L. Chervinsky
(74) Attorney, Agent, or Firm—Klarquist Sparkman Campbell Leigh & Whinston, LLP

(57) ABSTRACT

The present invention suggests a new scheme of integrating a heat conducting promotion apparatus (or heat sink) and a chip carrier (such as a substrate) of an IC package including a chip. It is characterized by at least a cavity which is in the chip carrier and around the chip, and the configuration of the heat conducting promotion apparatus having a first part which is close to or contacts a heat conducting surface of the chip, and a second part which extends from the first part toward the cavity until it partly contacts a surface of the chip carrier and partly is inside of the cavity. It is also characterized by options of placing at least an elastic entity in the cavity to contact the heat conducting promotion apparatus' part which is inside the cavity, or twisting the heat conducting promotion apparatus' part which is inside the cavity. Such schemes immunize an IC package against the warpage of heat conducting promotion apparatus resulting from the thermal stress suffered by the chip in the IC package, thereby the adaptability of the IC package to environment and the quality reliability of the IC package can be significantly promoted.

17 Claims, 3 Drawing Sheets

INTEGRATION OF HEAT CONDUCTING APPARATUS AND CHIP CARRIER IN IC PACKAGE

FIELD OF THE INVENTION

The present invention generally relates to schemes for integrating heat conducting promotion apparatus and substrates of an IC (integrated circuits) package, particularly to schemes of integrating a heat sink and a substrate in packaging flip chips for resolving problems arising from thermal stress.

BACKGROUND OF THE INVENTION

A conventional scheme of packaging a flip chip is shown in FIG. 1, where bumps 11 of flip chip 1 connect a surface 21 of substrate 2, a heat sink 3 includes a first portion 31 located above the heat dissipation surface 12 of flip chip 1, and a second portion 32 connected to the surface 21 through thermal paste 5, with heat sink 3 usually connected to surface 12 by adhesive material 4. The heat sink 3 in such a conventional package usually suffers warpage as shown in FIG. 2 when there arises thermal stress with the chip 1 in the package, and may even break away from flip chip 1 or substrate 2, resulting in very low adaptability of the package to environmental variation, and inevitably leading to extreme difficulty in predicting application reliability of the package product. Typical examples of this conventional scheme can be known from two prior arts: U.S. Pat. Nos. 5,724,729 and 5,587,882.

Although the prior art U.S. Pat. No. 5,311,402 differs from the aforementioned two prior arts, its scheme of integrating the so called "cap" and the substrate thereof is substantially similar to the aforementioned two prior arts, only with a difference that the cap thereof has its peripheral portion extending into the groove of the substrate thereof and being connected to the inner face of the groove through solder material. Such a package, when the chip therein suffers thermal stress, usually also has the cap thereof suffering warpage, resulting in low adaptability of the package to environmental variation, and inevitably leading to extreme difficulty in predicting application reliability of the package product.

To improve conventional schemes of packaging ICs including heat conducting promotion apparatus, the present invention suggests novel schemes of integrating heat conducting promotion apparatus (or those similar to the so called "cap" in U.S. Pat. No. 5,311,402) and substrates in packaging chips, enabling each manufacturer to select from among them the one most fitting individual conditions.

SUMMARY OF THE INVENTION

An object of the present invention is to provide chip packages in which heat conducting promotion apparatus and substrates are so integrated as to immunize the chip packages against application unreliability resulting from thermal stress.

Another object of the present invention is to provide several novel schemes of integrating heat conducting promotion apparatus and substrates in packaging chips, in order to enable each manufacturer to select from among these schemes the one most fitting its conditions, thereby the related industries may significantly promote the adaptability of chip packages to environmental variation, and the application reliability of chip packages can thus be greatly upgraded in simple, flexible, and economical ways.

A key difference between the present invention and conventional arts is that the heat conducting promotion apparatus and substrate in the chip packages suggested by conventional arts are connected through adhesive material or solder, while the chip package suggested by the present invention is characterized by its heat conducting promotion apparatus partly contacting a surface of its substrate and partly extending into a cavity of the substrate. The chip package suggested by the present invention is also characterized by the structure of its heat conducting promotion apparatus' part extending into the cavity and the different schemes of integrating its heat conducting promotion apparatus and substrate. For example, its heat conducting promotion apparatus' part extending into the cavity may be in a twisty shape, and may be connected to the inner face of the cavity through elastic paste, or be coupled with an elastic solid preset in the cavity. As a result of these features, the thermal stress suffered by the chips packaged according to the present invention can be absorbed by the twisty part of the heat conducting promotion apparatus, or by the elastic paste or the elastic solid, enabling related industries to promote the adaptability of chip packages to environmental variation in simple, economical, and flexible ways, leading to significant improvements in application reliability of chip packages.

The present invention may be typically represented by an electronic device such as a chip package product. The electronic device comprises:

at least a semiconductor unit (such as a chip) including a heat conducting surface (or heat dissipation surface) and a connecting portion (such as bump or bumps of a flip chip);

an object (such as a chip carrier, or specifically a substrate) including a connecting surface having at least one cavity, the connecting surface being attached by the connecting portion of the semiconductor unit; and a heat conducting promotion apparatus (or heat sink) including a first part, a second part, and a third part, with the first part close to the heat conducting surface, the second part extending from the first part to the connecting surface, and the third part extending from the second part to the cavity.

The present invention may best be understood through the following description with reference to the accompanying drawings, in which:

DETAILED DESCRIPTION OF THE PREFERRED EMBODIMENTS

Figure 1:
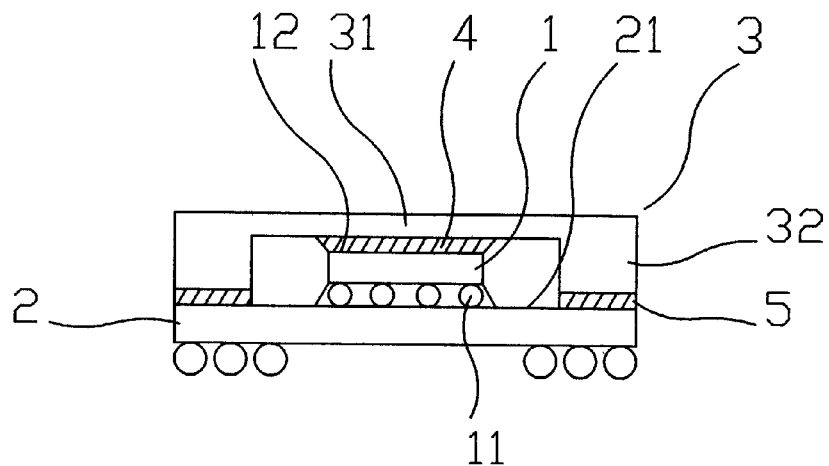
FIG. 1 shows the connection between a heat conducting promotion apparatus and a substrate in a typical conventional IC package.
Figure 2:
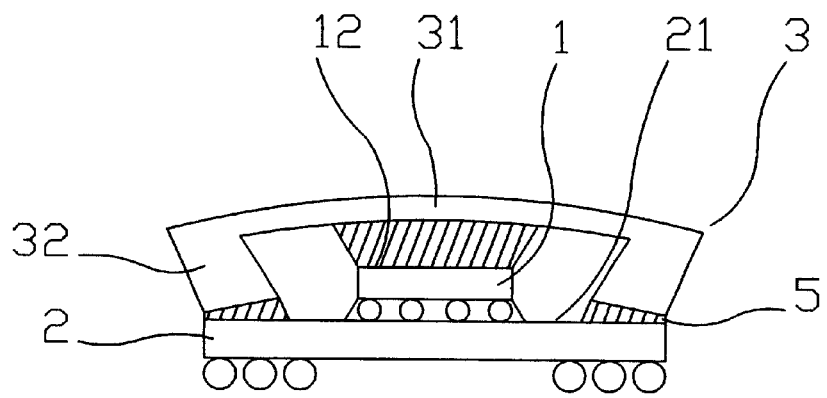
FIG. 2 shows a transfigure in the IC package of FIG. 1 as a result of thermal stress suffered by the components in the IC package.
Figure 3:
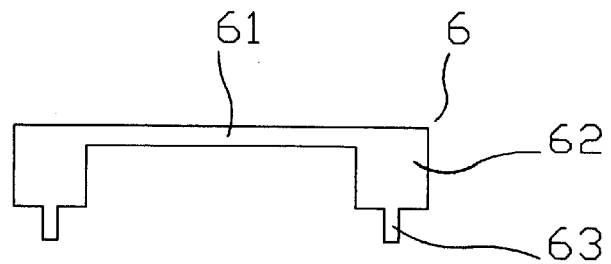
FIG. 3 shows a cross sectional view of a heat conducting promotion apparatus in an IC package provided by the present invention.
Figure 4:
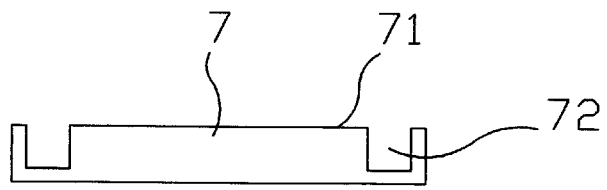
FIG. 4 shows a cross sectional view of a chip carrier (or a substrate) in an IC package provided by the present invention.
Figure 5:
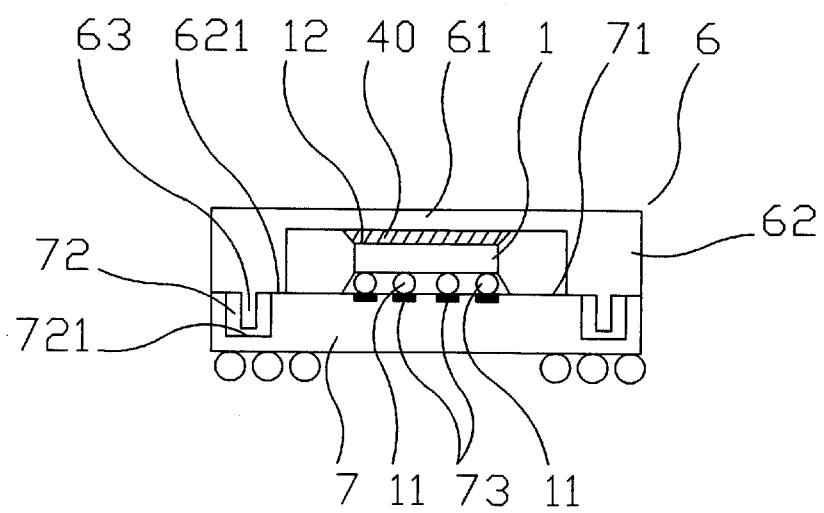
FIG. 5 shows an embodiment of an IC package according to the present invention.

Shown in FIG. 5 is a typical configuration of an electronic device representing an embodiment of the present invention, where heat conducting promotion apparatus 6 is depicted by FIG. 3 and object 7 such as a substrate is depicted by FIG. 4. The electronic device comprises:

a semiconductor unit 1 (such as a chip) including a heat conducting surface 12 (or heat dissipation surface) and a connecting portion 11 (such as bump or bumps of a flip chip);

an object 7 (such as a substrate) including a connecting surface 71 having at least one cavity 72, where the connecting surface 71 is attached by the connecting portion 11 of the semiconductor unit 1; and a heat conducting promotion apparatus 6 (or heat sink) including a first part 61, a second part 62, and a third part 63, where the first part 61 is close to the heat conducting surface 12, the second part 62 extends from the first part 61 to the connecting surface 71, and the third part 63 extends from the second part 62 into the cavity 72.

As shown in FIG. 5, the directions of both the heat conducting surface 12 of semiconductor unit 1 and the connecting surface 71 of object 7 in the electronic device are approximately the same and are upward.

According to the electronic device shown in FIG. 5, one type of semiconductor unit 1 may be a flip chip, and connecting portion 11 thereof may include at least a bump, or connecting portion 11 itself is a bump or bumps.

According to the electronic device shown in FIG. 5, connecting surface 71 of object 7 may include at least a conductor 73 (such as a pad) for electrically connecting semiconductor unit 1 through the connecting portion 11. The size of cavity 72 is big enough to accommodate the third part 63 of heat conducting promotion apparatus 6.

According to the present invention, the third part 63 of heat conducting promotion apparatus 6 in the above electronic device may be deemed another portion of second part 62 of heat conducting promotion apparatus 6, i.e., second part 62 may be deemed an entity extending from first part 61 toward cavity 72, until a portion 621 thereof touches connecting surface 71 of object 7 and meantime the portion 63 thereof is in cavity 72.

It shall be understood that the extending path of second part 62 from first part 61 is not limited to that shown in FIG. 5. The extending path may also be in a slanting direction or in the shape of an arc. A particular type of cavity 71 is a groove and another particular type of cavity 71 is in the shape of a cylinder.

Figure 6:
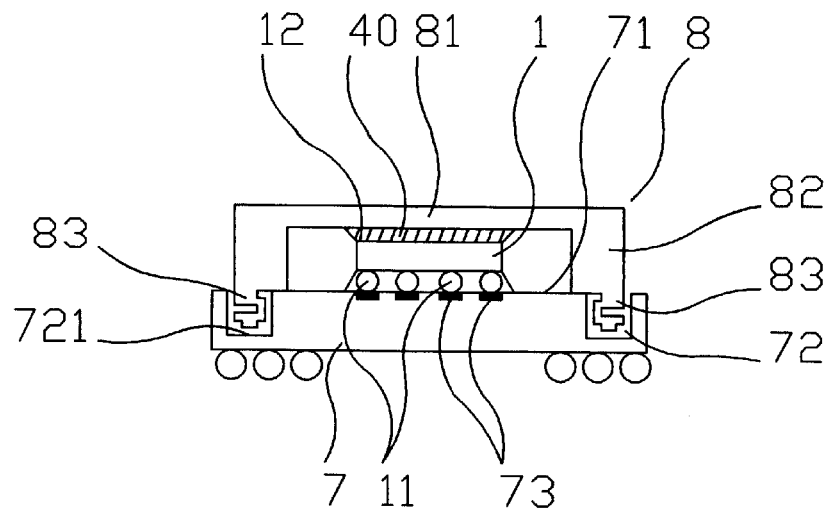
FIG. 6 shows another embodiment of an IC package according to the present invention.

Obviously in the above electronic device, according to the present invention, a particular embodiment of connecting surface 71 may include at least three cavities 72 in cylindrical shape, and a particular embodiment of heat conducting promotion apparatus 6 may include at least three third parts 63 (three cylinders, for example, only two among which are shown in FIG. 6) respectively extending into cavities 72. A particular embodiment of the electronic device based on the present invention may be characterized by a configuration that the three cylinders 63 are spaced from each other by approximately equal distances, and are in the peripheral region of heat conducting promotion apparatus 6.

Shown in FIG. 6 is another electronic device representing the present invention, where the third parts 83 of heat conducting promotion apparatus 8 are in twisty shape so that the thermal stress suffered by components such as semiconductor unit 1 can be better absorbed, thereby the electronic device can effectively cope with thermal stress.

The particular type of heat conducting promotion apparatus shown in FIG. 6 includes two third parts 83 both in the twisty shapes which are symmetrical relative to semiconductor unit 1.

Obviously there may be a further embodiment of an electronic device based on the present invention represented by FIG. 5 and FIG. 6, in which connecting surface 71 of substrate 7 includes at least four cylindrical cavities 72, and the third part 63 of the heat conducting promotion apparatus 6 includes at least four cylinders (only two of them are shown in FIG. 5 and FIG. 6) respectively extending into the cavities 72, and being spaced away from the semiconductor unit 1 by approximately equal distances, and being located in the peripheral region of the heat conducting promotion apparatus 6.

Figure 7:
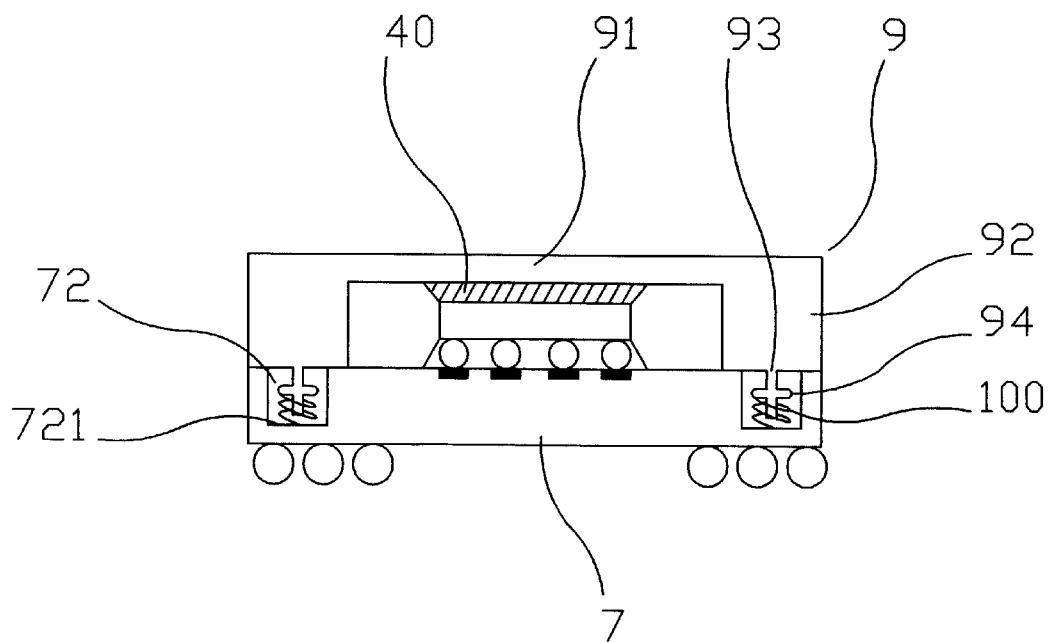
FIG. 7 shows a further embodiment of an IC package according to the present invention.

Shown in FIG. 7 is another further embodiment of an electronic device based on the present invention, which further comprises at least a spring 100, and where the third part 93 of heat conducting promotion apparatus 9 includes at least a cross tenon 94, and the spring 100 is placed between cross tenon 94 and the inner face 721 or bottom of cavity 72.

In all the aforementioned electronic devices, the heat conducting promotion apparatus, particularly its first part, is capable of dissipating or conducting away the heat produced in semiconductor unit 1.

Each embodiment of the electronic device based on the present invention, no matter it is shown in FIG. 5 or FIG. 6 or FIG. 7, may further include an adhesive layer 40 between heat conducting surface 12 of semiconductor unit 1 and the first part (61 in FIG. 5, 81 in FIG. 6, 91 in FIG. 7) of the heat conducting promotion apparatus, for connecting semiconductor unit 1 and heat conducting promotion apparatus (6 in FIG. 5, 8 in FIG. 6, 9 in FIG. 7). The adhesive layer 40 is made of adhesive paste. Each embodiment of the electronic device based on the present invention, no matter it is shown in FIG. 5 or FIG. 6 or FIG. 7, may also further include an elastic entity placed in cavity 72 (spring 100 in FIG. 7 is a specific example). The elastic entity may be selected from among elastic paste and elastic solid, and be placed between the inner face 721 of cavity 72 and the third part (63 in FIG. 5, 83 in FIG. 6, 93 in FIG. 7) of heat conducting promotion apparatus, It is clear now that the scheme for connecting a heat conducting promotion apparatus and a substrate in an IC package according to the present invention differs significantly from conventional arts, and provides several types of embodiments each capable of absorbing thermal stress suffered by the chip in the IC package, enabling related industries to promote the adaptability of chip packages to environmental variation in simple, economical, and flexible ways, leading to significant improvements in application reliability of chip packages or IC packages.

While the invention has been described in terms of what are presently considered to be the most practical and preferred embodiments, it shall be understood that the invention needs not be limited to the disclosed embodiment. On the contrary, it is intended to cover various modifications and similar arrangements based on the spirit and scope of the appended claims which shall be accorded with the broadest interpretation so as to encompass all such modifications and similar structures.

What is claimed is:

1. An electronic device comprising:
   a semiconductor unit including a heat conducting surface and a connecting portion;

an object including a connecting surface having at least a cavity, said connecting surface being attached by the connecting portion of said semiconductor unit; and a heat conducting promotion apparatus including a first part, a second part, and a third part, with said first part close to said heat conducting surface, said second part extending from said first part to said connecting surface, and said third part extending from said second part to said cavity, wherein said third part is in twisty shape to cope with thermal stress.

2. The electronic device according to claim 1 wherein said semiconductor unit is a flip chip, and said connecting portion includes at least a bump.

3. The electronic device according to claim 1 wherein said object is a substrate.

4. The electronic device according to claim 2 wherein said connecting surface includes at least a conductor for electrically connecting said bump.

5. The electronic device according to claim 1 wherein the second part of said heat conducting promotion apparatus contacts said connecting surface.

6. The electronic device according to claim 1 wherein said cavity is a groove.

7. The electronic device according to claim 1 wherein said cavity is in a cylindrical shape.

8. The electronic device according to claim 1 wherein said connecting surface includes at least two cylindrical cavities, and the third part of said heat conducting promotion apparatus includes at least two cylinders respectively extending into said cavities.

9. The electronic device according to claim 1 the third part of said heat conducting promotion apparatus is located in the peripheral region of said heat conducting promotion apparatus.

10. The electronic device according to claim 1 further comprising an adhesive layer placed between said heat conducting surface and the first part of said heat conducting promotion apparatus for connecting said semiconductor unit and said heat conducting promotion apparatus.

11. The electronic device according to claim 1 wherein the first part of said heat conducting promotion apparatus is material of heat conductivity.

12. The electronic device according to claim 1 wherein said connecting surface includes at least two cylindrical cavities, and the third part of said heat conducting promotion apparatus includes at least two cylinders respectively extending into said cavities, and being spaced away from said semiconductor unit by approximately equal distances, and being located in the peripheral region of said heat conducting promotion apparatus.

13. The electronic device according to claim 1 wherein said connecting surface includes at least two cylindrical cavities, and the third part of said heat conducting promotion apparatus includes at least two cylinders respectively extending into said cavities, and being located in the opposite sides of said semiconductor unit, and being in the twisty shapes which are symmetrical relative to said semiconductor unit.

14. The electronic device according to claim 1 further comprising at least a spring, and the third part of said heat conducting promotion apparatus in the electronic device according to claim 1 includes at least a cross tenon, said spring placed between said cross tenon and the inner face of said cavity.

15. The electronic device according to claim 1 wherein said cavity contains an elastic entity which is between the inner face of said cavity and the third part of said heat conducting promotion apparatus, and is selected from among elastic paste and an elastic solid.

16. The electronic device according to claim 1 wherein the third part of said heat conducting promotion apparatus is in twisty shape for coping with the thermal stress suffered by said heat conducting promotion apparatus.

17. An electronic device comprising:

a semiconductor unit including a heat conducting surface and a connecting portion;

an object including a connecting surface having at least one cavity, said connecting surface being attached by the connecting portion of said semiconductor unit; and a heat conducting promotion apparatus including a first part and a second part, with said first part connected to said heat conducting surface, said second part extending from said first part toward said connecting surface until said connecting surface is touched by said second part and meantime said cavity contains one portion of said second part, wherein the portion of said second part contained in said cavity is in twisty shape.

\* \* \* \* \*

UNITED STATES PATENT AND TRADEMARK OFFICE
CERTIFICATE OF CORRECTION

PATENT NO. : 6,282,096 B1
DATED : August 28, 2001
INVENTOR(S) : Lo et al.

It is certified that error appears in the above-identified patent and that said Letters Patent is hereby corrected as shown below:

Column 5,
Line 31, read "9. The electronic device according to claim 1 the third part of said heat conducting promotion apparatus is located in the peripheral region of said heat conducting promotion apparatus.", should read -- 9. The electronic device according to claim 1 wherein the third part of said heat conducting promotion apparatus is located in the peripheral region of said heat conducting promotion apparatus. --

Signed and Sealed this

Seventh Day of September, 2004

JON W. DUDAS
*Director of the United States Patent and Trademark Office*